(12) United States Patent
Miyazaki et al.

(10) Patent No.: US 7,741,643 B2
(45) Date of Patent: Jun. 22, 2010

(54) THIN FILM TRANSISTOR

(75) Inventors: Chihiro Miyazaki, Tokyo (JP); Manabu Ito, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 100 days.

(21) Appl. No.: 12/075,873

(22) Filed: Mar. 13, 2008

(65) Prior Publication Data
US 2008/0237600 A1    Oct. 2, 2008

(30) Foreign Application Priority Data
Mar. 28, 2007    (JP) .............................. 2007-084221

(51) Int. Cl.
*H01L 29/94* (2006.01)
(52) U.S. Cl. .................... 257/66; 257/72; 257/E29.001
(58) Field of Classification Search .................. 257/213
See application file for complete search history.

(56) References Cited

U.S. PATENT DOCUMENTS

| | | | | |
|---|---|---|---|---|
| 5,672,888 | A * | 9/1997 | Nakamura ................... 257/72 |
| 6,433,359 | B1 * | 8/2002 | Kelley et al. .................. 257/40 |
| 6,563,174 | B2 * | 5/2003 | Kawasaki et al. ........... 257/350 |
| 6,838,308 | B2 * | 1/2005 | Haga ........................... 438/104 |
| 6,887,776 | B2 * | 5/2005 | Shang et al. ................ 438/612 |
| 6,946,676 | B2 * | 9/2005 | Kelley et al. .................. 257/40 |
| 7,005,674 | B2 * | 2/2006 | Lee et al. ...................... 257/40 |
| 7,081,640 | B2 * | 7/2006 | Uchida et al. ................ 257/40 |
| 7,259,392 | B2 * | 8/2007 | Kim et al. ..................... 257/40 |
| 7,326,957 | B2 * | 2/2008 | Halik et al. ................... 257/40 |
| 7,352,038 | B2 * | 4/2008 | Kelley et al. ................ 257/410 |
| 7,364,940 | B2 * | 4/2008 | Kim et al. ..................... 438/99 |
| 7,368,336 | B2 * | 5/2008 | Lee et al. ..................... 438/151 |
| 7,435,989 | B2 * | 10/2008 | Nakayama et al. ............ 257/40 |
| 7,491,590 | B2 * | 2/2009 | Maekawa ..................... 438/158 |
| 7,535,010 | B2 * | 5/2009 | Saito et al. .............. 250/370.09 |
| 2003/0047785 | A1 * | 3/2003 | Kawasaki et al. ........... 257/350 |
| 2004/0222412 | A1 * | 11/2004 | Bai et al. ...................... 257/40 |
| 2005/0023579 | A1 * | 2/2005 | Yamazaki .................... 257/288 |
| 2005/0039670 | A1 * | 2/2005 | Hosono et al. ................ 117/2 |
| 2005/0082541 | A1 * | 4/2005 | Satou ........................... 257/72 |
| 2005/0255622 | A1 * | 11/2005 | Kokura et al. ................. 438/30 |
| 2005/0263765 | A1 * | 12/2005 | Maekawa ..................... 257/69 |
| 2005/0275038 | A1 * | 12/2005 | Shih et al. ................... 257/382 |
| 2006/0003485 | A1 * | 1/2006 | Hoffman et al. .............. 438/73 |

(Continued)

FOREIGN PATENT DOCUMENTS

JP    2006-165532    6/2006

*Primary Examiner*—Leonardo Andújar
*Assistant Examiner*—William Harriston
(74) *Attorney, Agent, or Firm*—Squire, Sanders & Dempsey, L.L.P.

(57) ABSTRACT

One embodiment of the present invention is a thin film transistor, including: an insulating substrate; a gate electrode, a gate insulating layer and a semiconductor layer including an oxide, these three elements being formed over the insulating substrate in this order, and the gate insulating layer including: a lower gate insulating layer, the lower gate insulating layer being in contact with the insulating substrate and being an oxide including any one of the elements In, Zn or Ga; and an upper gate insulating layer provided on the lower gate insulating layer, the upper gate insulating layer comprising at least one layer; and a source electrode and a drain electrode formed on the semiconductor layer.

14 Claims, 3 Drawing Sheets

U.S. PATENT DOCUMENTS

| | | | |
|---|---|---|---|
| 2006/0011909 A1* | 1/2006 | Kelley et al. | 257/40 |
| 2006/0027805 A1* | 2/2006 | Koo et al. | 257/59 |
| 2006/0079037 A1* | 4/2006 | Hoffman et al. | 438/158 |
| 2006/0113565 A1* | 6/2006 | Abe et al. | 257/197 |
| 2006/0141685 A1* | 6/2006 | Kim et al. | 438/149 |
| 2006/0163655 A1* | 7/2006 | Hoffman et al. | 257/347 |
| 2006/0176423 A1* | 8/2006 | Lee | 349/96 |
| 2006/0244107 A1* | 11/2006 | Sugihara et al. | 257/646 |
| 2006/0289858 A1* | 12/2006 | Park et al. | 257/40 |
| 2007/0069206 A1* | 3/2007 | Lee et al. | 257/40 |
| 2007/0072439 A1* | 3/2007 | Akimoto et al. | 438/795 |
| 2007/0075322 A1* | 4/2007 | Nakamura et al. | 257/97 |
| 2007/0090358 A1* | 4/2007 | Kanno et al. | 257/59 |
| 2007/0152214 A1* | 7/2007 | Hoffman et al. | 257/43 |
| 2007/0161165 A1* | 7/2007 | Liu et al. | 438/151 |
| 2007/0172591 A1* | 7/2007 | Seo et al. | 427/248.1 |
| 2007/0178672 A1* | 8/2007 | Tanaka et al. | 438/487 |
| 2007/0194302 A1* | 8/2007 | Inoue et al. | 257/40 |
| 2007/0196962 A1* | 8/2007 | Morisue et al. | 438/149 |
| 2007/0243650 A1* | 10/2007 | Kim et al. | 438/38 |
| 2007/0264761 A1* | 11/2007 | Lee et al. | 438/149 |
| 2007/0272922 A1* | 11/2007 | Kim et al. | 257/43 |
| 2008/0001151 A1* | 1/2008 | Jun et al. | 257/59 |
| 2008/0171422 A1* | 7/2008 | Tokie et al. | 438/479 |
| 2008/0185677 A1* | 8/2008 | Yang et al. | 257/529 |
| 2008/0237600 A1* | 10/2008 | Miyazaki et al. | 257/66 |

* cited by examiner

THIN FILM TRANSISTOR

CROSS REFERENCE TO RELATED APPLICATION

This application claims priority to Japanese application number 2007-084221, filed on Mar. 28, 2007, which is incorporated herein by references.

BACKGROUND OF THE INVENTION

1. Field of the Invention

The present invention is related to a thin film transistor, the transistor being able to be used for a driving device of various image display devices, a logic device of various logic circuits or the like.

2. Description of the Related Art

Currently, the main stream of general flat panel displays (FPD) is an active matrix type which is driven by a field-effect transistor using an amorphous silicon or a polycrystal silicon for a semiconductor.

Further, in recent years, the use of a plastic substrate instead of a glass substrate has been tried for the purpose of further improvement in making a FPD thinner, lighter, and improving impact resistance and flexibility of a FPD.

However, manufacturing a thin film transistor using the above-mentioned silicon for a semiconductor requires a heating process of a high temperature. Therefore, it is difficult to adapt manufacture of the thin film transistor which uses silicon for a semiconductor to a plastic substrate having a low heat resistance.

Therefore, a field-effect transistor having an oxide which can be formed at a low temperature as a semiconductor has been actively developed. (Patent document 1)

Further, for example, inorganic materials such as silicon oxide, silicon nitride, aluminium oxide and yttria are used for a gate insulating layer of a field-effect transistor having the oxide semiconductor.

However, as for these gate insulating layers, since adhesion to a substrate is low, the gate insulating layer can easily peel from the substrate. Thereby, there was a problem in that a thin film transistor having good transistor characteristics could not be obtained.

[Patent document 1] JP-A-2006-165532

SUMMARY OF THE INVENTION

One embodiment of the present invention is a thin film transistor, having: an insulating substrate; a gate electrode, a gate insulating layer and a semiconductor layer including an oxide, these three elements being formed over the insulating substrate in this order, and the gate insulating layer comprising: a lower gate insulating layer, the lower gate insulating layer being in contact with the insulating substrate and being an oxide including any one element of In, Zn or Ga; and an upper gate insulating layer provided on the lower gate insulating layer, the upper gate insulating layer comprising at least one layer; and a source electrode and a drain electrode formed on the semiconductor layer.

In these drawings, 10 is an insulating substrate; 11 is a gate electrode; 12 is a gate insulating layer; 12a is a lower gate insulating layer; 12b is an upper gate insulating layer; 13 is a semiconductor layer; 14 is a source electrode; and 15 is a drain electrode.

DETAILED DESCRIPTION OF THE INVENTION

The object of the present invention is to provide a thin film transistor of good transistor characteristics, the transistor having a substrate and a gate insulating layer wherein adhesion between the substrate and the gate insulating layer is high, in order to solve the above-mentioned problem.

Hereinafter, embodiments of the present invention are described referring to the figures, however the present invention is not limited to these embodiments.

Figure 1:
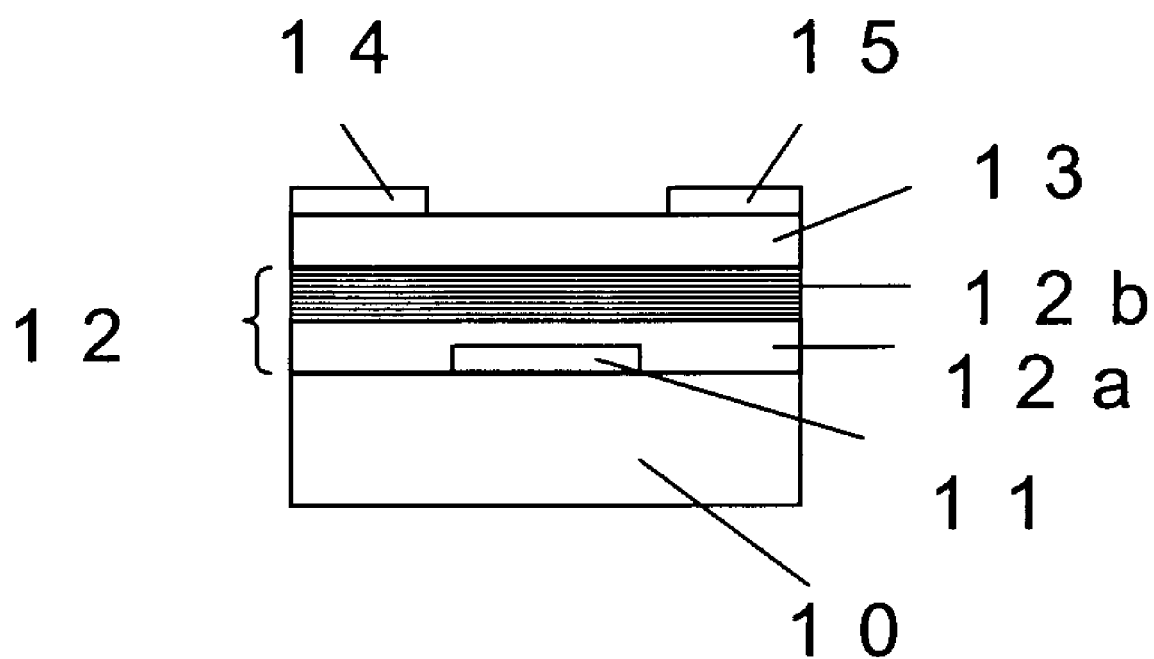
FIG. 1 is a schematic diagram of a structure of a thin film transistor of an embodiment of present invention.

FIG. 1 shows an example of a thin film transistor of the present invention. A gate electrode 11, a gate insulating layer 12, a semiconductor layer 13, a source electrode 14 and a drain electrode 15 are formed over an insulating substrate 10. Further, the gate insulating layer 12 has a lower gate insulating layer 12a and an upper gate insulating layer 12b. The lower gate insulating layer 12a is in contact with the insulating substrate and is an oxide including at least any one of the elements In, Zn and Ga.

Figure 2:
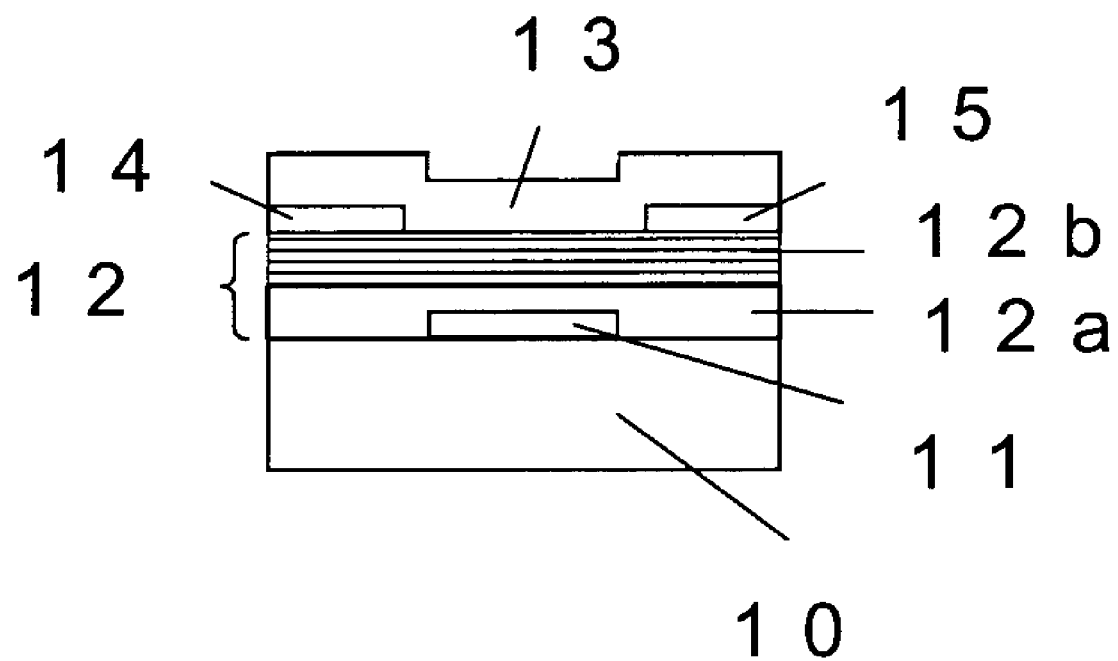
FIG. 2 is a schematic diagram of a structure of a thin film transistor of another embodiment of present invention.

FIG. 2 shows another example of a thin film transistor of the present invention. A gate electrode 11, a gate insulating layer 12, a source electrode 14, a drain electrode 15 and a semiconductor layer 13 between the source electrode 14 and the drain electrode 15 are formed over an insulating substrate 10. Further, the gate insulating layer 12 has a lower gate insulating layer 12a and an upper gate insulating layer 12b. The lower gate insulating layer 12a is in contact with the insulating substrate and is an oxide including at least any one of the elements In, Zn and Ga.

For example, a glass or plastic substrate can be used for the insulating substrate 10. Polymethyl methacrylate, acrylics, polycarbonate, polystyrene, polyethylene sulfide, polyethersulfone, polyolefin, polyethylene terephthalate, polyethylenenaphthalate, cyclo-olefin polymers, polyether sulfone, triacetylcellulose, polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, transparent polyimide, fluorinated resin and cyclic polyolefin resin can be used for a plastic substrate. A substrate comprising only one material from among the above mentioned materials can be used, but a composite substrate comprising two or more materials from among the above mentioned materials can also be used.

If a flexible substrate such as a plastic film is used, a thin, light and flexible thin film transistor can be preferably obtained. In addition, if the manufacturing method includes a heating treatment such as a drying process, PES and PEN as a plastic film, as well as a glass substrate such as quartz having a high heat stability, are preferred.

In addition, when the insulating substrate is a plastic substrate, it is preferable to form a transparent gas barrier layer in order to raise the durability of the device. $Al_2O_3$, $SiO_2$, $SiN$, $SiON$, $SiC$, diamondlike carbon (DLC) or the like can be used for the gas barrier layer. In addition, the gas barrier layer may comprise two or more layers. In addition, the gas barrier layer may be formed on just one side of the plastic substrate, or it may also be formed on both sides. The gas barrier layer can be formed by evaporation method, ion plating method, sputter method, laser ablation method, plasma CVD (Chemical Vapor Deposition) method, hot wire CVD method and sol-gel process. In addition, a base material in which a color filter is formed on a glass or plastic substrate can be used.

Oxide materials such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$), zinc tin oxide ($Zn_2SnO_4$) and indium zinc oxide (In—Zn—O) can be preferably used for a gate electrode 11, a source electrode 14 and a drain electrode 15. In addition, these materials doped with an impurity are preferably used in order to increase electrical conductivity. For example, indium oxide doped with tin (Sn), molybdenum (Mo) or titanium (Ti), tin oxide doped with antimony (Sb) or fluorine (F), zinc oxide doped with indium, aluminum and gallium (Ga) can be used. Among these doped materials, indium tin oxide (common name ITO) which is an indium oxide doped with tin (Sn) is preferably used, because ITO has a low electrical resistivity. In addition, a low resistance metal material such as Au, Ag, Cu, Cr, Al, Mg and Li can be preferably used. In addition, an electrode having plural layers comprising the conductive oxide material and the low resistance metal material can be used. In this case, in order to prevent oxidation and time degradation of a metallic material, a three-layer structure, that is, conductive oxide thin film/metallic thin film/conductive oxide thin film, is preferably used. In addition, organic conducting materials such as PEDOT (polyethylene dihydroxy thiophen) can be preferably used. The materials used for a gate electrode, a source electrode and a drain electrode may be identical or all of the materials may be different from each other. In addition, in order to reduce the number of processes, it is preferable that materials of a source electrode and a drain electrode are identical. These electrodes can be formed by vacuum evaporation method, ion plating method, sputter method, laser ablation method, plasma CVD technique, photo-CVD, hot wire CVD method, screen printing, relief printing and ink jet method.

A gate insulating layer 12 is comprised of a lower gate insulating layer 12a and an upper gate insulating layer 12b. It is desirable that the thickness of the gate insulating layer 12 is 50 nm-5 μm. In the present invention, a material used for the lower gate insulating layer 12a being in contact with the insulating substrate 10 is an oxide including any one of the elements In, Zn and Ga. For example, indium oxide gallium zinc ($InGaZnO_4$), zinc oxide (ZnO), gallium oxide ($Ga_2O_3$) and gallium oxide zinc ($ZnGa_2O_4$) can be used. However, the usable materials are not limited to these. The structure of these materials may be monocrystal, polycrystal, crystallite, mixed crystal of crystal/amorphous, nanocrystal scattering amorphous or amorphous. A resistance value of the lower gate insulating layer 12a is preferably equal to or more than $10^{10}$ Ω·cm. It is more preferably equal to or more than $10^{12}$ Ω·cm. In the case where the resistance value is less than $10^{10}$ Ω·cm, a sufficient insulating property can not be obtained over the entire gate insulating layer. Thereby, a gate leakage current is increased, and good device characteristics may not be obtained.

In the above-mentioned oxide materials, since oxygen deficiency easily occurs, the oxide materials may be used for a conductive material or a semiconductor material. However, the resistance value thereof can be equal to or more than $10^{10}$ Ω·cm in the case where a composition of a film is made to be near a stoichiometric ratio by controlling film formation conditions.

In addition, in order to obtain good device characteristics, it is desirable that a film thickness of the lower gate insulating layer 12a is equal to or less than ⅔ of the total film thickness of the gate insulating layer. In the case where a film thickness of the lower gate insulating layer 12a is more than ⅔ of the total film thickness of the gate insulating layer, a sufficient insulating property can not be obtained over the entire gate insulating layer. Thereby, a gate leakage current is increased, and good device characteristics may not be obtained.

In addition, it is desirable that a film thickness of the lower gate insulating layer 12a be 2 nm-200 nm. In the case where the thickness is less than 2 nm, the entire surface of the substrate tends not to be completely covered by the layer. In the case where the thickness is more than 200 nm, stress in the layer is increased. Therefore, the layer is easily peeled off.

The lower gate insulating layer 12a can be formed by sputter method, pulsed laser deposition, vacuum evaporation method, CVD method and sol-gel process, however sputter method, pulsed laser deposition, vacuum evaporation method and CVD method are preferably used. For sputter method, RF magnetron sputtering technique and DC sputter method can be used, for vacuum deposition, heating evaporation, electron beam evaporation and ion plating method can be used, and for CVD method, hot wire CVD method and plasma CVD technique can be used, but usable methods are not limited to these methods.

An upper gate insulating layer 12b of a thin film transistor of the present invention can be a one-layer structure or can be a structure including a plurality of layers. A material of the upper gate insulating layer 12b is not especially limited if the material has a sufficient insulating property for controlling a gate leakage current. However, it is desirable that an electrical resistivity thereof be equal to or more than $10^{11}$ Ω·cm. Further, it is more desirable that the electrical resistivity be equal to or more than $10^{14}$ Ω·cm.

For example, as an inorganic material, silicon oxide, silicon nitride, silicon oxy nitride, aluminum oxide, tantalum oxide, yttria, hafnium oxide, hafnium aluminates, oxidation zirconia, titanium oxide or the like can be used. The use of these materials can allow a sufficient insulating property for controlling a gate leakage current to be obtained.

In addition, as an organic material, polyacrylates such as PMMA (polymethyl methacrylate), PVA (polyvinyl alcohol), PS (polystyrene), transparent polyimide, polyester, epoxy, poly vinylphenol and polyvinyl alcohol can be used. The use of these materials can allow a sufficient insulating property for controlling a gate leakage current to be obtained.

The upper gate insulating layer 12b can be formed by vacuum evaporation method, ion plating method, sputter method, laser ablation method, plasma CVD technique, photo-CVD, hot wire CVD method, spin coat, dip coat screen printing or the like. In addition, these upper gate insulating layers 12b having a composition which slopes toward the growth direction of the film can be preferably used.

For a semiconductor layer 13 of a thin film transistor of the present invention, an oxide including one or more elements from among zinc, indium, tin, tungsten, magnesium and gallium can be used. Well-known materials such as zinc oxide, indium oxide, indium zinc oxide, tin oxide, tungsten oxide and zinc gallium indium oxide (In—Ga—Zn—O) can be used. However the usable materials are not limited to these. The structure of these materials may be monocrystal, polycrystal, crystallite, mixed crystal of crystal/amorphous, nanocrystal scattering amorphous or amorphous. As for the film thickness of the semiconductor layer, it is preferable to be equal to or more than 10 nm. In the case where the film thickness is less than 10 nm, an island shaped film is formed, thereby parts where the semiconductor is not formed easily appear in the film.

An oxide semiconductor layer can be formed by sputter method, pulsed laser deposition, vacuum evaporation method, CVD method and sol-gel process, however sputter method, pulsed laser deposition, vacuum evaporation method and CVD method are preferably used. For sputter method, RF magnetron sputtering technique and DC sputter method can be used, for vacuum deposition, heating evaporation, electron beam evaporation and ion plating method can be used, and for CVD method, hot wire CVD method and plasma CVD technique can be used, but usable methods are not limited to these methods.

As for an oxide, if a ratio of oxygen is changed while a ratio of a constituent metal element is not changed, a thin film having different electric characteristics (resistance value) can be formed. For example, in the case where sputtering is performed, even if the same target is used, a film having different characteristics can be obtained when a partial pressure of oxygen is changed. Therefore, in the case where an oxide is used for a semiconductor layer, a lower gate insulating layer 12a and a semiconductor layer 13 can be formed using an identical material wherein electric characteristics of the lower gate insulating layer 12a are different from characteristics of the semiconductor layer 13. Thereby, manufacturing costs can be reduced. Therefore, such a method is desirable.

In the case where the lower insulating layer, which is in contact with the insulating substrate, is an oxide including any one element of In, Zn and Ga, adhesion between the insulating substrate and the gate insulating substrate is improved.

In the case where at least one layer of the upper insulating layer includes any one of the compounds of silicon oxide, silicon nitride, silicon oxy nitride, aluminum oxide, tantalum oxide, yttria, hafnium oxide, hafnium aluminates, zirconia oxide and titanium oxide, a sufficient insulating property is obtained and a gate leakage current is controlled.

In the case where at least one layer of the upper insulating layer includes any one of compounds of polyacrylate, polyvinyl alcohol, polystyrene, polyimide, polyester, epoxy, poly vinylphenol and polyvinyl alcohol, a sufficient insulating property is obtained and a gate leakage current is controlled.

In the case where a film thickness of the lower gate insulating layer is equal to or less than ⅔ of the total film thickness of the gate insulating layer, a sufficient insulating property can be obtained over the entire gate insulating layer and a gate leakage current is controlled. In addition, since a material used for the lower gate insulating layer is more expensive than a material used for the upper insulating material, manufacturing costs are reduced if the film thickness of the lower gate insulating layer is equal to or less than ⅔ of the total film thickness of the gate insulating layer.

In the case where a film thickness of the lower gate insulating layer is equal to or more than 2 nm, the film is prevented from becoming island shaped and the film can cover the entire surface of the insulating substrate completely. In addition, in the case where a film thickness of the lower gate insulating layer is equal to or less than 200 nm, the film is prevented from being peeled off wherein the increase of stress of the film due to the increase of the film thickness causes the film to be peeled off.

In the case where resistivity of the lower gate insulating layer is equal to or more than $10^{10}$ Ω·cm, a sufficient insulating property is achieved over the entire gate insulating layer. Thereby, a gate leakage current is controlled.

In the case where the insulating substrate is a flexible substrate, a thin-type, light and flexible thin film transistor is provided.

According to the present invention, the lower gate insulating layer, which is in contact with the insulating substrate, is an oxide including any one of the elements In, Zn and Ga. Therefore, the adhesion property between the substrate and the gate insulating layer is improved. Therefore, a thin film transistor having good transistor characteristics can be provided, wherein, in the thin film transistor, the mobility and the on/off ratio are high and the gate leakage current is low.

EXAMPLES

Example 1

A PEN substrate (Q65, a product of Teijin Du Pont: film thickness was 125 μm.) was used as an insulating substrate 10. ITO was deposited on the insulating substrate 10 to 100 nm. A gate electrode 11 was formed by a photolithography method. Next, the following layers were continuously formed by a RF magnetron sputtering method: a lower gate insulating layer 12a (film thickness: 100 nm) comprising an In—Ga—Zn—O system oxide, the layer 12a being in contact with the insulating substrate 10; an upper gate insulating layer 12b (film thickness: 200 nm) comprising SiON; and a semiconductor layer 13 (film thickness: 40 nm) comprising an In—Ga—Zn—O system oxide. A resistance value of the lower gate insulating layer 12a was $3.2 \times 10^{14}$ Ω·cm. Table 1 shows the conditions in film formation by a sputtering method. Further, an Al source electrode 14 and a drain electrode 15 were formed to 150 nm film thickness by EB (electron beam) vapor-deposition using a mask. Thereby a thin film transistor device 1 was obtained (FIG. 1). Here, a channel length between the source electrode and the drain electrode was 0.2 mm and a channel width was 2 mm. In addition, the film thickness was measured by a tracer type film thickness meter (Dektak6M: a product of ULVAC).

TABLE 1

| | target | Flow rate of Ar [SCCM] | Flow rate of $O_2$ [SCCM] | Operating pressure [Pa] | Input power [W] |
|---|---|---|---|---|---|
| Gate electrode 11 | $SnO_2$: 10 wt. % - $In_2O_3$ | 10 | 0.3 | 0.5 | 200 |
| Lower gate insulating layer 12a | $InGaZnO_4$ | 10 | 2 | 0.5 | 200 |
| Upper gate insulating layer 12b | $Si_3N_4$ | 40 | 2 | 0.5 | 200 |
| Semiconductor active layer 13 | $InGaZnO_4$ | 10 | 0.3 | 0.5 | 200 |

Adhesion between the lower gate insulating layer 12a and the insulating substrate of the manufactured thin film transistor device 1 was evaluated by the cross-cut method. Peeling was not observed and good adhesion was observed.

Adhesion between the gate insulating layer 12 and the insulating substrate 10 was evaluated using an adhesion testing method according to JIS-K-5600 (1999) 5-6. A good result was obtained. That is, the result was an adhesion of 0 in terms of classification. The end of a cut was completely smooth and no peeling of a grid square occurred. In addition, the cross-cut method was performed by using a cutter guide of 1 mm gap.

The characteristics of the thin film transistor 1 were measured by using a semiconductor parameter analyzer (SCS4200, a product of Keithlay). Mobility was 7 $cm^2$/Vs. In the case where 10V was applied between the source electrode and the drain electrode, the number of places in ON/OFF ratio was 6. In the case where the gate voltage was 20 V, the gate leakage current was $4.2 \times 10^{-11}$ A. Good transistor characteristics were obtained and the gate leakage current was sufficiently controlled (Table 5).

Example 2

In FIG. 1, a thin film transistor 2 was obtained by the same method as Example 1 except for the film thicknesses of a lower gate insulating layer 12a (film thickness: 150 nm) and an upper gate insulating layer 12b (film thickness: 150 nm). A resistance value of the lower gate insulating layer 12a was $2.8 \times 10^{14}$ Ω·cm.

Adhesion was evaluated by the same method as Example 1. Peeling between the lower gate insulating layer 12a of the manufactured thin film transistor device 2 and the insulating substrate 10 was not observed. Adhesion was good.

Adhesion between the gate insulating layer 12 and the insulating substrate 10 was evaluated by the same method as Example 1, that is, the adhesion testing according to JIS-K-5600 (1999)5-6 (the cross-cut method). Adhesion was good. That is, the classification was 0.

In addition, the characteristics of the thin film transistor 2 were measured by using the same semiconductor parameter analyzer. Mobility was 5 cm²/Vs. In the case where 10V was applied between the source electrode and the drain electrode, the number of places in ON/OFF ratio was 6. In the case where the gate voltage was 20 V, the gate leakage current was $1.1 \times 10^{-11}$ A. Good transistor characteristics were obtained and the gate leakage current was sufficiently controlled (Table 5).

Example 3

In FIG. 1, a thin film transistor 3 was obtained by the same method as Example 1 except for the film thicknesses of a lower gate insulating layer 12a (film thickness: 200 nm) and an upper gate insulating layer 12b (film thickness: 100 nm). A resistance value of the lower gate insulating layer 12a was $3.2 \times 10^{14}$ Ω·cm.

Adhesion was evaluated by the same method as Example 1. Peeling between the lower gate insulating layer 12a of the manufactured thin film transistor device 3 and the insulating substrate 10 was not observed. Adhesion was good.

Adhesion between the gate insulating layer 12 and the insulating substrate 10 was evaluated by the same method as Example 1, that is, the adhesion testing according to JIS-K-5600 (1999)5-6 (the cross-cut method). Adhesion was good. That is, the classification was 0.

In addition, the characteristics of the thin film transistor 3 were measured by using the same semiconductor parameter analyzer. Mobility was 6 cm² Vs. In the case where 10V was applied between the source electrode and the drain electrode, the number of places in ON/OFF ratio was 5. In the case where the gate voltage was 20 V, the gate leakage current was $5.5 \times 10^{-10}$ A. Good transistor characteristics were obtained and the gate leakage current was sufficiently controlled (Table 5).

Example 4

In FIG. 1, a thin film transistor 4 was obtained by the same method as Example 1 except for the film thicknesses of a lower gate insulating layer 12a (film thickness: 225 nm) and an upper gate insulating layer 12b (film thickness: 75 nm). A resistance value of the lower gate insulating layer 12a was $3.2 \times 10^{14}$ Ω·cm.

Adhesion was evaluated by the same method as Example 1. Peeling between the lower gate insulating layer 12a of the manufactured thin film transistor device 4 and the insulating substrate 10 was not observed. Adhesion was good.

Adhesion between the gate insulating layer 12 and the insulating substrate 10 was evaluated by the same method as Example 1, that is, the adhesion testing according to JIS-K-5600 (1999)5-6 (the cross-cut method). Adhesion was good. That is, the classification was 0.

In addition, the characteristics of the thin film transistor 4 were measured by using the same semiconductor parameter analyzer. Mobility was 4 cm²/Vs. In the case where 10V was applied between the source electrode and the drain electrode, the number of places in ON/OFF ratio was 3. In the case where the gate voltage was 20 V, the gate leakage current was $8.1 \times 10^{-7}$ A. It was observed that the ON/OFF ratio reduced and gate leakage current increased compared with the devices in Examples 1-3. However, a large influence as a device characteristic was not observed (Table 5).

Example 5

In FIG. 1, a thin film transistor 5 was obtained by the same method as Example 1 except for the film thicknesses of a lower gate insulating layer 12a (film thickness: 240 nm) and an upper gate insulating layer 12b (film thickness: 60 nm). A resistance value of the lower gate insulating layer 12a was $4.0 \times 10^{14}$ Ω·cm.

Adhesion was evaluated by the same method as Example 1. Peeling between the lower gate insulating layer 12a of the manufactured thin film transistor device 5 and the insulating substrate 10 was not observed. Adhesion was good.

Adhesion between the gate insulating layer 12 and the insulating substrate 10 was evaluated by the same method as Example 1, that is, the adhesion testing according to JIS-K-5600 (1999)5-6 (the cross-cut method). Adhesion was good. That is, the classification was 0.

In addition, the characteristics of the thin film transistor 5 were measured by using the same semiconductor parameter analyzer. Mobility was 5 cm²/Vs. In the case where 10V was applied between the source electrode and the drain electrode, the number of places in ON/OFF ratio was 2. In the case where the gate voltage was 20 V, the gate leakage current was $4.0 \times 10^{-5}$ A. It was observed that the ON/OFF ratio reduced and gate leakage current increased compared with devices in Examples 1-3. However, a large influence as a device characteristic was not observed (Table 5).

Example 6

In FIG. 1, a thin film transistor 6 was obtained by the same method as Example 1 except for the film thicknesses of a lower gate insulating layer 12a (film thickness: 200 nm), an upper gate insulating layer 12b (film thickness: 100 nm) and a condition of film formation of the upper gate insulating layer 12b. Table 2 shows conditions of film formation by a sputtering method. A resistance value of the lower gate insulating layer 12a was $2.2 \times 10^{10}$ Ω·cm.

TABLE 2

|  | target | Flow rate of Ar [SCCM] | Flow rate of O$_2$ [SCCM] | Operating pressure [Pa] | Input power [W] |
|---|---|---|---|---|---|
| Gate electrode 11 | SnO$_2$: 10 wt. % - In$_2$O$_3$ | 10 | 0.3 | 0.5 | 200 |
| Lower gate insulating layer 12a | InGaZnO$_4$ | 10 | 1 | 0.5 | 200 |
| Upper gate insulating layer 12b | Si$_3$N$_4$ | 40 | 2 | 0.5 | 200 |
| Semiconductor active layer 13 | InGaZnO$_4$ | 10 | 0.3 | 0.5 | 200 |

Adhesion was evaluated by the same method as Example 1. Peeling between the lower gate insulating layer 12a of the manufactured thin film transistor device 6 and the insulating substrate 10 was not observed. Adhesion was good.

Adhesion between the gate insulating layer 12 and the insulating substrate 10 was evaluated by the same method as Example 1, that is, the adhesion testing according to JIS-K-5600 (1999)5-6 (the cross-cut method). Adhesion was good. That is, the classification was 0.

In addition, the characteristics of the thin film transistor 6 were measured by using the same semiconductor parameter analyzer. Mobility was 5 cm$^2$/Vs. In the case where 10V was applied between the source electrode and the drain electrode, the number of places in ON/OFF ratio was 4. In the case where the gate voltage was 20 V, the gate leakage current was $1.5 \times 10^{-9}$ A. (Table 5)

Example 7

FIG. 1, a thin film transistor 7 was obtained by the same method as Example 1 except for the film thicknesses of a lower gate insulating layer 12a (film thickness: 200 nm), an upper gate insulating layer 12b (film thickness: 100 nm) and a condition of film formation of the upper gate insulating layer 12b. Table 3 shows conditions of film formation by a sputtering method. A resistance value of the lower gate insulating layer 12a was $2.2 \times 10^9$ Ω·cm.

TABLE 3

|  | target | Flow rate of Ar [SCCM] | Flow rate of O$_2$ [SCCM] | Operating pressure [Pa] | Input power [W] |
|---|---|---|---|---|---|
| Gate electrode 11 | SnO$_2$: 10 wt. % - In$_2$O$_3$ | 10 | 0.3 | 0.5 | 200 |
| Lower gate insulating layer 12a | InGaZnO$_4$ | 10 | 0.8 | 0.5 | 200 |
| Upper gate insulating layer 12b | Si$_3$N$_4$ | 40 | 2 | 0.5 | 200 |
| Semiconductor active layer 13 | InGaZnO$_4$ | 10 | 0.3 | 0.5 | 200 |

Adhesion was evaluated by the same method as Example 1. Peeling between the lower gate insulating layer 12a of the manufactured thin film transistor device 7 and the insulating substrate 10 was not observed. Adhesion was good.

Adhesion between the gate insulating layer 12 and the insulating substrate 10 was evaluated by the same method as Example 1, that is, the adhesion testing according to JIS-K-5600 (1999)5-6 (the cross-cut method). Adhesion was good. That is, the classification was 0.

In addition, the characteristics of the thin film transistor 7 were measured by using the same semiconductor parameter analyzer. Mobility was 3 cm$^2$ Vs. In the case where 10V was applied between the source electrode and the drain electrode, the number of places in ON/OFF ratio was 2. In the case where the gate voltage was 20 V, the gate leakage current was $1.2 \times 10^{-6}$ A. It was observed that mobility reduced, the ON/OFF ratio reduced and gate leakage current increased compared with devices in Examples 3 and 6. However, a large influence as a device characteristic was not observed (Table 5).

Comparative Example 1

Figure 3:
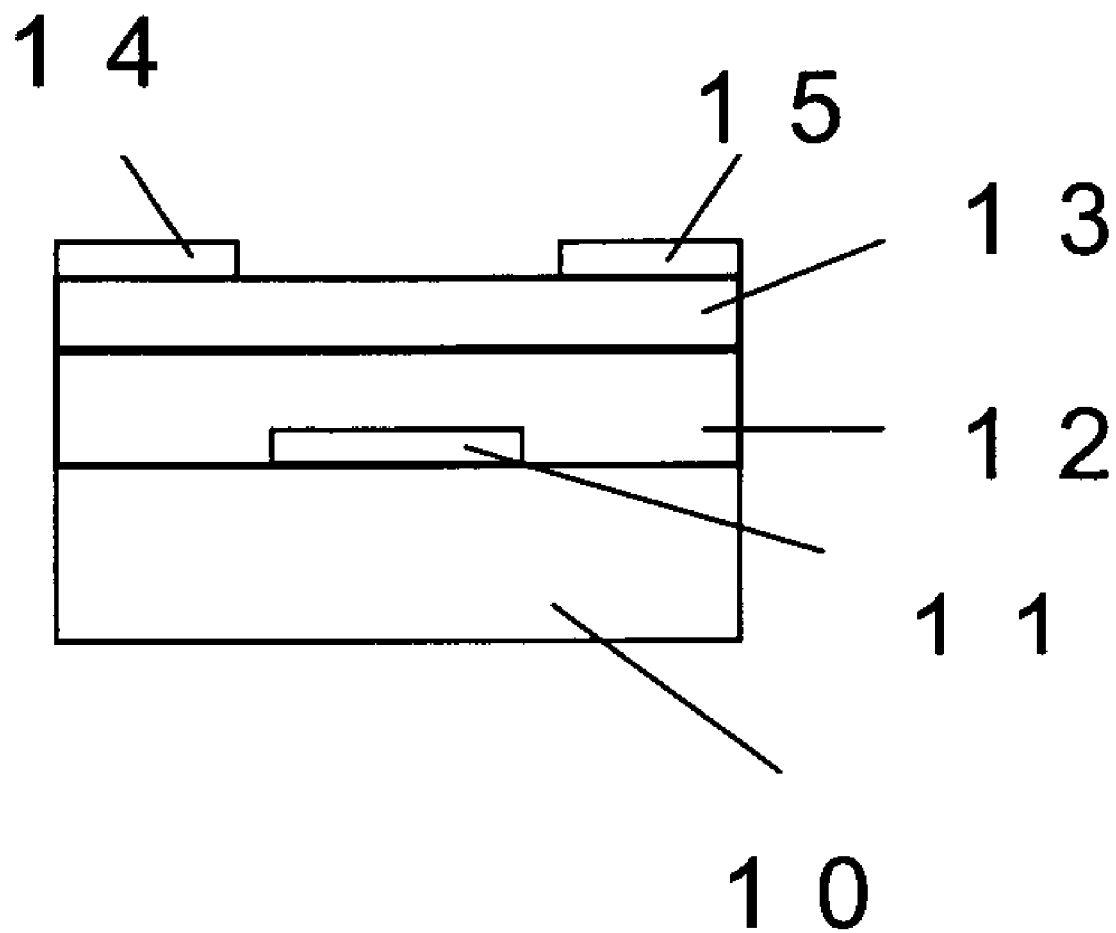
FIG. 3 is a schematic diagram of a structure of a thin film transistor of Comparative Example 1.

In FIG. 1, a thin film transistor 8 was obtained by the same method as Example 1 except that a single layer of SiON (film thickness: 300 nm) was formed as a gate insulating layer 12 (FIG. 3). Table 4 shows a film formation condition by a sputtering method. A resistance value of a gate insulating layer 12 was $3.6 \times 10^{14}$ Ω·cm.

TABLE 4

|  | Target | Flow rate of Ar [SCCM] | Flow rate of O$_2$ [SCCM] | Operating pressure [Pa] | Input power [W] |
|---|---|---|---|---|---|
| Gate electrode 11 | SnO$_2$: 10 wt. % - In$_2$O$_3$ | 10 | 0.3 | 0.5 | 200 |
| Gate insulating layer 12 | Si$_3$N$_4$ | 40 | 2 | 0.5 | 200 |
| Semiconductor active layer 13 | InGaZnO$_4$ | 10 | 0.3 | 0.5 | 200 |

Adhesion was evaluated by the same method as Example 1. It was observed that partial peeling between a gate insulating layer of the manufactured thin film transistor 8 and an insulating substrate 10 occurred. Adhesion was not good.

A partial peeling was visually observed. In addition, adhesion between the gate insulating layer 12 and the insulating substrate 10 was evaluated by the same method as Example 1, that is, the adhesion testing according to JIS-K-5600 (1999) 5-6 (the cross-cut method). That is, the classification was 5. [Degree of peeling was classification 4 (remarkable peeling of the coated film occurred partially or entirely along an edge of cutting, and/or, several grids were partially or entirely peeled. The influenced cross-cut part is more than 35% and less than 65%.)] Adhesion was bad.

In addition, the characteristics of the thin film transistor 8 were measured by using the same semiconductor parameter analyzer. Mobility was 7 cm$^2$/Vs. In the case where 10V was applied between the source electrode and the drain electrode, the number of places in ON/OFF ratio was 6. In the case where the gate voltage was 20 V, the gate leakage current was $3.5 \times 10^{-11}$ A. (Table 5).

TABLE 5

| Number of the device | Film thickness of a lower gate insulating layer/ film thickness of the entire gate insulating layer | Mobility (cm²/Vs) | ON/OFF (number of places) | Gate leakage current (A) | resistance value of a lower gate insulating layer (Ω·cm) | peeling |
|---|---|---|---|---|---|---|
| 1 | 1/3 | 7 | 6 | $4.2 \times 10^{-11}$ | $3.2 \times 10^{14}$ | Not occurred |
| 2 | 1/2 | 5 | 6 | $1.1 \times 10^{-11}$ | $2.8 \times 10^{14}$ | Not occurred |
| 3 | 2/3 | 6 | 5 | $5.5 \times 10^{-10}$ | $3.2 \times 10^{14}$ | Not occurred |
| 4 | 3/4 | 4 | 3 | $8.1 \times 10^{-7}$ | $3.2 \times 10^{14}$ | Not occurred |
| 5 | 4/5 | 5 | 2 | $4.0 \times 10^{-5}$ | $4.0 \times 10^{14}$ | Not occurred |
| 6 | 2/3 | 5 | 4 | $1.5 \times 10^{-9}$ | $2.2 \times 10^{10}$ | Not occurred |
| 7 | 2/3 | 3 | 2 | $1.2 \times 10^{-6}$ | $2.2 \times 10^{9}$ | Not occurred |
| 8 | 0 | 7 | 6 | $3.5 \times 10^{-11}$ | $3.6 \times 10^{14}$ | occurred |

What is claimed is:

1. A thin film transistor, comprising:
an insulating substrate;
a gate electrode, a gate insulating layer and a semiconductor layer including an oxide formed over said insulating substrate,
said gate insulating layer further comprising:
a lower gate insulating layer in contact with said insulating substrate and including an oxide having any one of the elements In, Zn or Ga; and
an upper gate insulating layer provided on said lower gate insulating layer, said upper gate insulating layer having at least one layer; and
a source electrode and a drain electrode formed on said semiconductor layer.

2. A thin film transistor, comprising:
an insulating substrate;
a gate electrode and a gate insulating layer formed over said insulating substrate,
said gate insulating layer comprising:
a lower gate insulating layer in contact with said insulating substrate and including an oxide having any one of the elements In, Zn or Ga; and
an upper gate insulating layer provided on said lower gate insulating layer, said upper gate insulating layer having at least one layer;
a source electrode and a drain electrode formed on said gate insulating layer; and
a semiconductor layer including an oxide, said semiconductor layer being formed at least on said gate insulating layer between said source electrode and said drain electrode.

3. The thin film transistor according to claim 1, wherein at least one layer of said upper gate insulating layer includes any one of the compounds of silicon oxide, silicon nitride, silicon oxy nitride, aluminium oxide, tantalum oxide, yttria, hafnium oxide, hafnium aluminates, zirconia oxide and titanium oxide.

4. The thin film transistor according to claim 2, wherein at least one layer of said upper gate insulating layer includes any one of the compounds of silicon oxide, silicon nitride, silicon oxy nitride, aluminium oxide, tantalum oxide, yttria, hafnium oxide, hafnium aluminates, zirconia oxide and titanium oxide.

5. The thin film transistor according to claim 1, wherein at least one layer of said upper gate insulating layer includes any one of the compounds of polyacrylate, polyvinyl alcohol, polystyrene, polyimide, polyester, epoxy, poly vinylphenol and polyvinyl alcohol.

6. The thin film transistor according to claim 2, wherein at least one layer of said upper gate insulating layer includes any one of the compounds of polyacrylate, polyvinyl alcohol, polystyrene, polyimide, polyester, epoxy, poly vinylphenol and polyvinyl alcohol.

7. The thin film transistor according to claim 1, wherein a film thickness of said lower gate insulating layer is 2 nm-200 nm.

8. The thin film transistor according to claim 2, wherein a film thickness of said lower gate insulating layer is 2 nm-200 nm.

9. The thin film transistor according to claim 1, wherein a resistivity of said lower gate insulating layer is equal to or more than $10^{10}$ Ω·cm.

10. The thin film transistor according to claim 2, wherein a resistivity of said lower gate insulating layer is equal to or more than $10^{10}$ Ω·cm.

11. The thin film transistor according to claim 1, wherein said insulating substrate is a flexible substrate.

12. The thin film transistor according to claim 2, wherein said insulating substrate is a flexible substrate.

13. A thin film transistor, comprising:
an insulating substrate;
a gate electrode, a gate insulating layer and a semiconductor layer including an oxide formed over said insulating substrate,
said gate insulating layer further comprising:
a lower gate insulating layer in contact with said insulating substrate and including an oxide having any one of the elements In, Zn or Ga; and
an upper gate insulating layer provided on said lower gate insulating layer, said upper gate insulating layer having at least one layer; and
a source electrode and a drain electrode formed on said semiconductor layer,
wherein at least one layer of said upper gate insulating layer includes any one of the compounds of silicon oxide, silicon nitride, silicon oxy nitride, aluminium oxide, tantalum oxide, yttria, hafnium oxide, hafnium aluminates, zirconia oxide and titanium oxide, wherein at least one layer of said upper gate insulating layer includes any one of the compounds of polyacrylate, polyvinyl alcohol, polystyrene, polyimide, polyester, epoxy, poly vinylphenol and polyvinyl alcohol, wherein a film thickness of said lower gate insulating layer is 2 nm-200 nm and said film thickness of said lower gate insulating layer is equal to or less than ⅔ of the total thickness of said gate insulating layer, wherein a resistivity of said lower gate insulating layer is equal to or more than $10^{10}$ Ω·cm, and wherein said insulating substrate is a flexible substrate.

14. A thin film transistor, comprising:

an insulating substrate;

a gate electrode and a gate insulating layer formed over said insulating substrate, said gate insulating layer comprising:

a lower gate insulating layer in contact with said insulating substrate and including an oxide having any one of the elements In, Zn or Ga; and an upper gate insulating layer provided on said lower gate insulating layer, said upper gate insulating layer having at least one layer;

a source electrode and a drain electrode formed on said gate insulating layer; and a semiconductor layer including an oxide, said semiconductor layer being formed at least on said gate insulating layer between said source electrode and said drain electrode, wherein at least one layer of said upper gate insulating layer includes any one of the compounds of silicon oxide, silicon nitride, silicon oxy nitride, aluminium oxide, tantalum oxide, yttria, hafnium oxide, hafnium aluminates, zirconia oxide and titanium oxide, wherein at least one layer of said upper gate insulating layer includes any one of the compounds of polyacrylate, polyvinyl alcohol, polystyrene, polyimide, polyester, epoxy, poly vinylphenol and polyvinyl alcohol, wherein a film thickness of said lower gate insulating layer is 2 nm-200 nm and said film thickness of said lower gate insulating layer is equal to or less than ⅔ of the total thickness of said gate insulating layer, wherein a resistivity of said lower gate insulating layer is equal to or more than $10^{10}$ Ω·cm, and wherein said insulating substrate is a flexible substrate.

* * * * *